United States Patent
Wu et al.

(10) Patent No.: US 8,497,171 B1
(45) Date of Patent: Jul. 30, 2013

(54) FINFET METHOD AND STRUCTURE WITH EMBEDDED UNDERLYING ANTI-PUNCH THROUGH LAYER

(75) Inventors: Wei-Hao Wu, Hsinchu (TW); Kai-Chieh Yang, Zhubei (TW); Wen-Hsing Hsieh, Taichung (TW); Ken-Ichi Goto, Hsin-Chu (TW); Zhiqiang Wu, Chubei (TW)

(73) Assignee: Taiwan Semiconductor Manufacturing Co., Ltd., Hsin-Chu ( * ) Notice: Subject to any disclaimer, the term of this patent is extended or adjusted under 35 U.S.C. 154(b) by 0 days.

(21) Appl. No.: 13/541,806

(22) Filed: Jul. 5, 2012

(51) Int. Cl.
    *H01L 21/8238* (2006.01)

(52) U.S. Cl.
    USPC ............... 438/218; 438/199; 438/219

(58) Field of Classification Search
    USPC ............. 438/199, 218, 219, 221, 294, 296, 438/424
    See application file for complete search history.

(56) References Cited

U.S. PATENT DOCUMENTS

| | | | |
|---|---|---|---|
| 7,811,890 B2 * | 10/2010 | Hsu et al. | 438/270 |
| 2006/0284245 A1 * | 12/2006 | Park et al. | 257/324 |
| 2006/0289953 A1 * | 12/2006 | Sakuma et al. | 257/412 |
| 2007/0042583 A1 * | 2/2007 | Jang et al. | 438/585 |
| 2007/0117344 A1 * | 5/2007 | Kim et al. | 438/404 |
| 2011/0147805 A1 * | 6/2011 | Irisawa et al. | 257/255 |

\* cited by examiner

*Primary Examiner* — Kevin M Picardat
(74) *Attorney, Agent, or Firm* — Duane Morris LLP

(57) ABSTRACT

Methods and structures for forming semiconductor FinFET devices with superior repeatability and reliability include providing APT (anti-punch through) layer accurately formed beneath a semiconductor fins, are provided. Both the n-type and p-type APT layers are formed prior to the formation of the material from which the semiconductor fin is formed. In some embodiments, barrier layers are added between the accurately positioned APT layer and the semiconductor fin. Ion implantation methods and epitaxial growth methods are used to form appropriately doped APT layers in a semiconductor substrate surface. The fin material is formed over the APT layers using epitaxial growth/deposition methods.

20 Claims, 5 Drawing Sheets

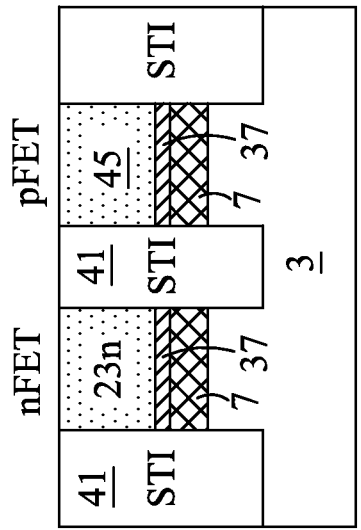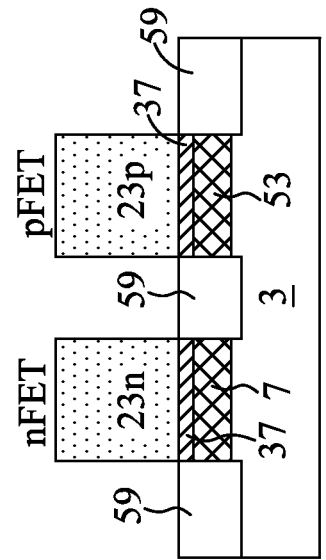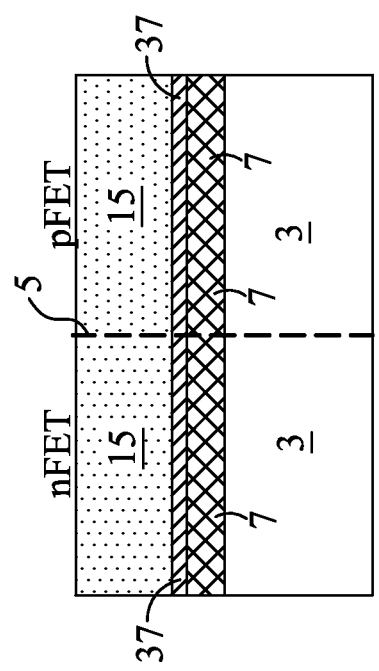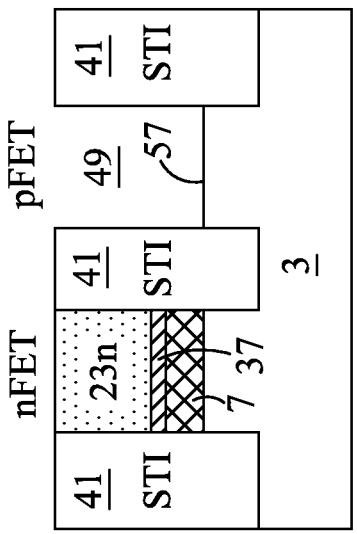
Fig. 3A
Fig. 3B
Fig. 3C
Fig. 3D

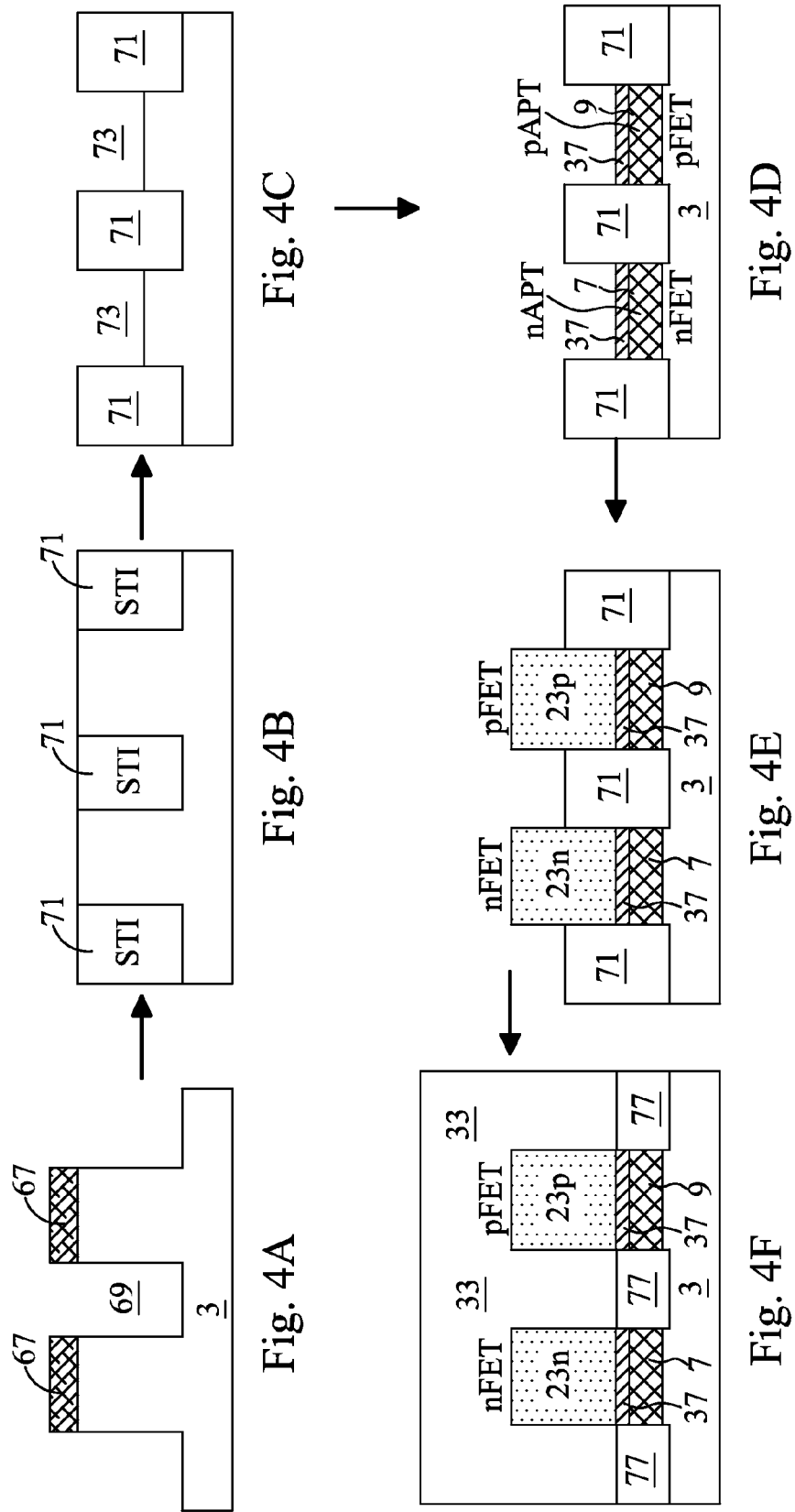

FINFET METHOD AND STRUCTURE WITH EMBEDDED UNDERLYING ANTI-PUNCH THROUGH LAYER

TECHNICAL FIELD

The disclosure relates, most generally, to semiconductor devices and methods for manufacturing semiconductor devices. More particularly, the disclosure relates to methods and structures for FinFET structures with embedded underlying anti-punch through layers.

BACKGROUND

With increased considerations of cost and reliability, there is a continuous demand for semiconductor devices with higher levels of integration, i.e., higher packing densities of transistors and other devices. In order to increase levels of integration, FinFET (fin Field Effect Transistor) devices are becoming very popular in semiconductor integrated circuits and other semiconductor devices in various applications. FinFET devices are transistors that utilize a semiconductor fin that extends above the substrate surface, as a channel region for transistors. The channel region has an increased area with respect to transistors with planar channels. In many cases, drive to reduce feature proportions and sizes results in changes in operational characteristics and cannot be made across the board, however.

The demand for higher levels of integration includes a push to reduce transistor channel length. Transistor channel lengths are limited to a certain level of reduction, however. If the channel length is reduced to be shorter than an operational limit, undesirable results such as short channel effects and punch through may occur. Anti-punch through layers are utilized under fins of FinFET transistors to reduce sub-threshold source-to-drain leakage and Drain-Induced Barrier Lowering (DIBL). Anti-punch through (APT) layers are formed by ion implantation through the fin and it is difficult and challenging to control the location of the APT layer with respect to the fin. Random dopant fluctuation of the APT layer can result when the ion implantation operation is carried out through the fin and this random dopant fluctuation results in mismatches between the fins. The performance of the FinFET transistors is also closely related to the location of the APT with respect to the fin. If the APT is formed in the substrate too deep beneath the fin, an undesirable short channel effect is created. The implantation through the fin also destroys the fin itself. When the APT layer is not formed deep enough into the substrate, the dopant impurities of the APT layer occupy the lower portion of the fin especially after the high heat treatments used in semiconductor manufacturing. These high heat treatments cause back-diffusion from the APT layer into the fin.

It would therefore be desirable to produce FinFET devices that include fins that have uniform characteristics throughout the device, are undamaged and include appropriately positioned APT layers that are not subject to diffusion into the fins.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

FIGS. 3A-3D are cross-sectional views showing another sequence of processing operations used to form a fin-type semiconductor device according to an embodiment of the disclosure; and FIGS. 4A-4F are cross-sectional views showing a further sequence of processing operations used to form a fin-type semiconductor device according to embodiment of the disclosure.

DETAILED DESCRIPTION

Figure 1A:
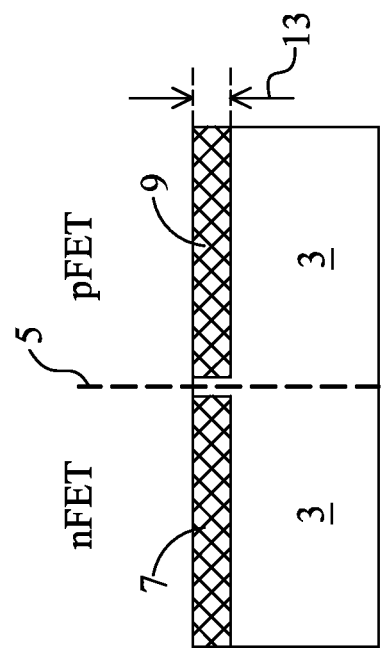
FIGS. 1A-1E are cross-sectional views showing a sequence of processing operations used to form a fin-type semiconductor device according to an embodiment of the disclosure.

FIG. 1A shows substrate 3. Substrate 3 is silicon in some embodiments and substrate 3 is formed of other suitable semiconductor materials in other embodiments. Substrate 3 is divided into nFET portions and pFET portions. In the illustrated embodiment of FIG. 1A, dashed line 5 separates nFET portion from pFET portion. Substrate 3 of FIG. 1A is representative of the multitude of nFET and pFET portions on a semiconductor substrate and which are in various spatial arrangements with respect to one another. The nFET and pFET portions do not overlap. N-type anti-punch through (APT) layer 7 is disposed in the nFET portion of substrate 3 and p-type APT layer 9 is disposed in the pFET portion of substrate 3. N-type APT layer 7 and p-type APT layer 9 are formed in or on the upper surface of substrate 3, in various embodiments. In one embodiment, n-type APT layer 7 and p-type APT layer 9 are formed by ion implantation and in another embodiment, n-type APT layer 7 and p-type APT layer 9 are formed by epitaxial growth. Although the epitaxial process involves the growth of a crystal layer on a lower layer with the same crystalline orientation, and is referred to herein as epitaxial growth, in some embodiments the epitaxial growth is implemented by means of chemical vapor deposition, i.e. by chemical reaction in a gas-phase, the product of which is a solid that is epitaxially deposited on the exposed surface. Other methods are used in other embodiments.

N-type APT layer 7 is a silicon material doped with B, $BF_2$, In or other suitable n-type dopants in other embodiments. The materials used for n-type APT layer 7 prevent punch through between the underlying substrate and semiconductor devices that use the fin over n-type APT layer 7 as a channel. P-type APT layer 9 is a silicon material doped with P, As or other suitable p-type dopants in other embodiments. The materials used for p-type APT layer 9 prevent punch through between the underlying substrate and semiconductor devices that will be formed using the fin over n-type APT layer 9 as a transistor channel. According to the embodiment in which n-type APT layer 7 and p-type APT layer 9 are formed by epitaxial growth, the respective layers are doped with the aforementioned impurities during the epitaxial growth operation.

Thickness 13 of each of n-type APT layer 7 and p-type APT layer 9 ranges from 10-60 nm in various embodiments, but other thicknesses are used in other embodiments. In each of the ion implantation and epitaxial growth embodiments, the n-type APT layer 7 and p-type APT layer 9 are selectively formed at different spatial locations on substrate 3 and do not overlap. Various masking techniques are available and are used to prevent one portion of the substrate from undergoing the ion implantation or epitaxial growth operation while the operation is being carried out in desired portions of substrate 3.

According to the embodiment in which n-type APT layer 7 and p-type APT layer 9 are formed by ion implantation, photomasks and hard masks represent embodiments of blocking materials suitable for isolating and blocking portions from being implanted. According to the embodiment in which n-type APT layer 7 and p-type APT layer 9 are formed by epitaxial growth, a hard mask is used in one embodiment to separate the respective regions and prevent the undesired regions from undergoing epitaxial growth with the desired impurities.

Figure 1B:
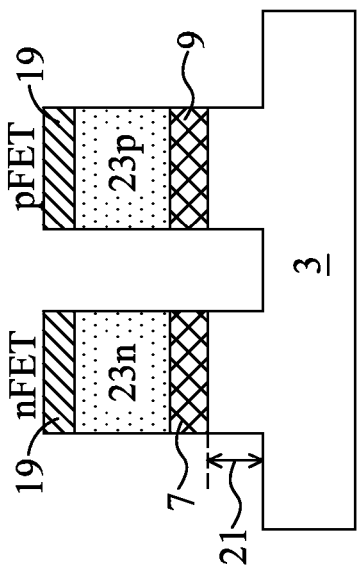
Figure 1C:
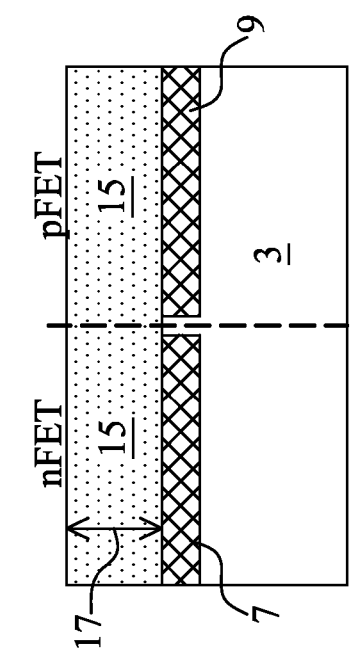

FIG. 1B shows the structure of FIG. 1A after fin material 15 is formed over the structure of FIG. 1A. Fin material 15 is formed by epitaxial growth and is undoped Si in one embodiment although other suitable semiconductor materials such as SiGe, and various III-V materials, are used in other embodiments. Fin material 15 includes thickness 17 that ranges from about 20 to 80 nm in various embodiments but other thicknesses are used in other embodiments.

Patterned hard mask 19 is formed using photolithographic techniques and with patterned hard mask 19 in place, an etching operation is carried out that etches through fin material 15, n-type APT layer 7 and p-type APT layer 9 in portions not covered by patterned hard mask 19. The etching operation also etches down into substrate 3 and recedes substrate 3 by a depth 21 which may be about 1200-1700 nm in one embodiment, but other depths are used in other embodiments. Fins 23n and 23p are formed from fin material 15 in the nFET and pFET regions, respectively.

Figure 1D:
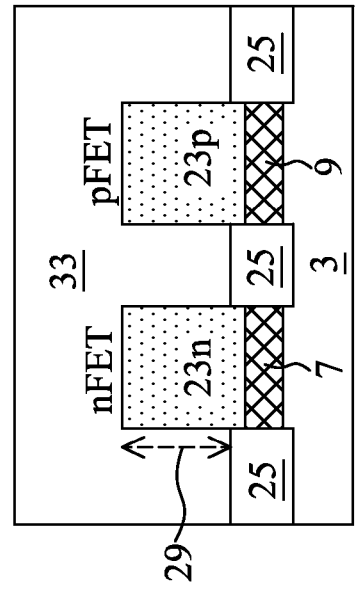
Figure 1E:
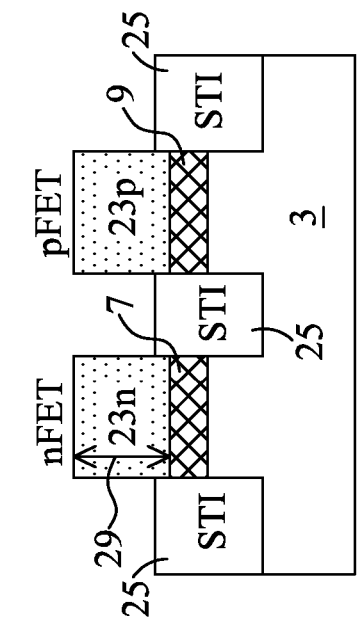

Shallow trench isolation, STI, structures 27 are formed as shown in FIG. 1D. After patterned hard mask 19 is removed, an oxide is formed over the structure and covering fins 23n and 23p. In one embodiment, a polishing operation such as CMP is carried out to planarize the oxide material to the top surface of fins 23n and 23p and this is followed by a selective oxide etching operation that recedes the oxide to form STI structures 25 shown in FIG. 1D. Fin thickness 29 is on the order of about 20-60 nm in one embodiment but other heights are used in other embodiments. FIG. 1E shows the structure of FIG. 1D after gate material 33 is formed over the structure. Gate material 33 is doped or undoped polysilicon in one embodiment but other materials are used in other embodiments. A gate dielectric is formed between gate material 33 and the respective fins 23n and 23 p. In some embodiments, gate material 33 represents a dummy gate, such as will be removed and replaced with a high-k gate dielectric material and metal gate in some embodiments. Gate material 33 or the subsequent final gate will undergo patterning operations to form separate gates over the nFET device with fin 23n and the pFET device with fin 23p.

FIGS. 2A-2D show a sequence of processing operations comparable to the sequence of processing operations shown in FIGS. 1B-1E but represent an embodiment in which a barrier layer is added between fin material 15 and the APT layers, n-type APT layer 7 and p-type APT layer 9.

Figure 2B:
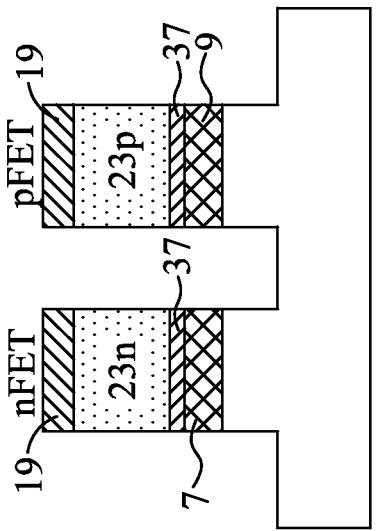
FIGS. 2A-2D are cross-sectional views showing another sequence of processing operations used to form a fin-type semiconductor device according to another embodiment of the disclosure.
Figure 2D:
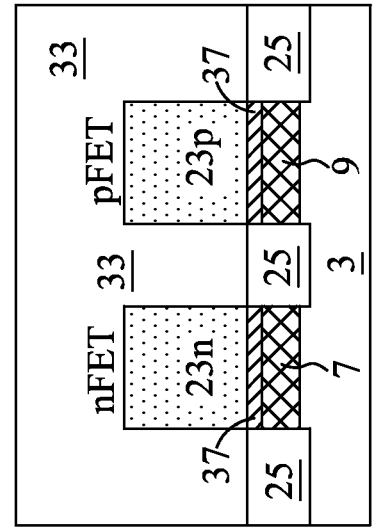
Figure 2A:
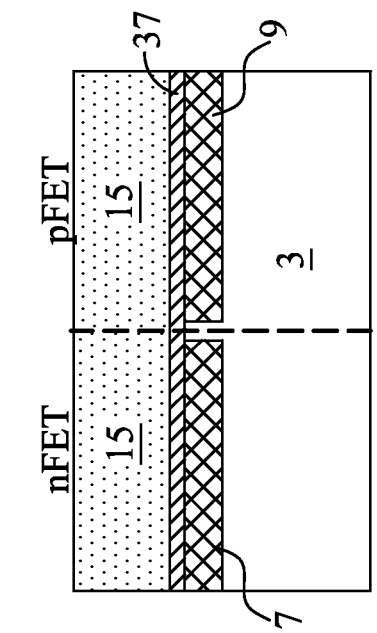

Now referring to FIG. 2A, barrier layer 37 is formed by blanket epitaxial growth in one embodiment and is formed using deposition methods in other embodiments. Barrier layer 37 includes a thickness within the range of about 1-10 nm in one embodiment but other thicknesses are used in other embodiments. Barrier layer 37 is formed of at least one of SiC, SiGe or other suitably heavily doped silicon materials in other embodiments. In another embodiment, barrier layer 37 is formed by ion implantation. According to the embodiment in which barrier layer 37 is formed by a blanket epitaxial growth operation, the subsequent epitaxial growth operation to form fin material 15 may be carried out in-situ. FIG. 2B shows the structure of FIG. 2A after an etching operation or sequence of etching operations is carried out to etch uncovered portions of fin material 15 and n-type APT layer 7 and p-type APT layer 9, to form discrete fins 23n and 23p from fin material 15. The etching operation or sequence of etching operations also etches through barrier layer 37.

Figure 2C:
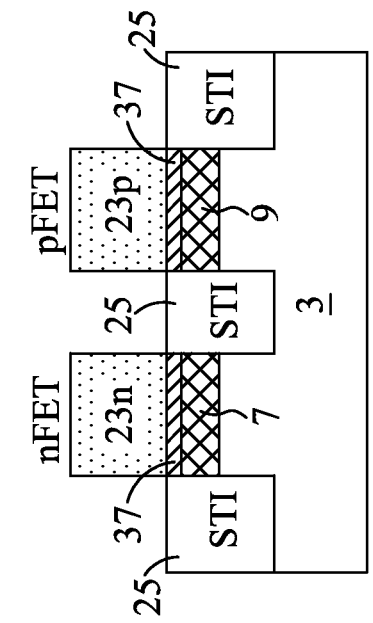

FIGS. 2C and 2D essentially show the structures of FIGS. 1D and 1E, respectively, with the addition of barrier layer 37, and are as described above.

FIGS. 3A-3D show another embodiment of a sequence of processing operations for forming semiconductor fin devices using a replacement fin technique. FIG. 3A shows substrate 3 with n-type APT layer 7 extending through both nFET and pFET areas beneath barrier layer 37 and fin material 15. N-type APT layer 7 is formed by selective epitaxial growth in one embodiment but other techniques such as ion implantation are used in other embodiments. In another embodiment, a p-type APT layer is formed to extend through both nFET and pFET areas beneath barrier layer 37 and fin material 15. FIG. 3B shows the structure of FIG. 3A after fins 23n and 45 have been formed by patterning and etching, and STI structures 41 have been formed between fins. The structure of FIG. 3B is formed by first patterning the structure of FIG. 3A then etching exposed portions through fin material 15, barrier layer 37, n-type APT layer 7 and into substrate 3. An oxide material is then deposited and planarized to form STI structures 41. FIG. 3B shows fin 23n in nFET region and dummy fin 45 formed in the pFET region.

Patterning and selective etching operations are then used to remove dummy gate 45, barrier layer 37 and n-type APT layer 7 from the pFET region, forming the structure shown in FIG. 3C. A hard mask or other masking film is then formed over portions of the structure shown in FIG. 3C isolating the pFET openings 49. A sequence of epitaxial growth operations are then used to form p-type APT layer 53, barrier layer 37 and a fin material successively on exposed surface 57 of FIG. 3C. After the films are formed within opening 49, a subsequent oxide etch-back procedure is used to recede STI structures 41, to produce the structure shown in FIG. 3D. The structure shown in FIG. 3D includes discrete fins including n-type fin 23n in the nFET area and p-type fin 23p in the pFET area. The discrete fins are separated by recessed STI portions 59. Further processing operations are then carried out to utilize the structure shown in FIG. 3D. The future processing operations include the formation of a dummy gate in some embodiments and include the formation of suitable gate dielectrics and gate materials over fins 23n and 23p in other embodiments.

FIGS. 4A-4F show another sequence of processing operations used to form n-type fins and p-type fins according to another embodiment. FIG. 4A shows substrate 3 patterned using mask 67 as an etching mask. Mask 67 is a patterned hard mask or a photomask, in various embodiments. Substrate 3 is silicon in some embodiments and substrate 3 is formed of other suitable semiconductor materials in other embodiments. Trenches 69 are formed between the portions of substrate 3 covered by mask 67. FIG. 4B shows the structure of FIG. 4A after the patterned mask 67 has been removed and STI structures 71 have been formed in previous trenches 69. STI structures 71 are formed using oxide deposition and planarization methods such as CMP, chemical mechanical polishing, or other polishing operations in various embodiments. FIG. 4C shows the structure of FIG. 4B after openings 73 have been formed between STI structures 71. Openings 73 are formed using selective etching operations that selectively etch substrate 3 material, but not STI structures 75.

Patterning operations are then used to isolate nFET areas from pFET areas and the previously described epitaxial growth operations are used to separately form n-type APT layer 7 and barrier layer 37 in nFET areas and p-type APT layer 9 and barrier layer 37 in pFET areas such as shown in FIG. 4D. Selective epitaxial growth or other techniques are used to form fins 23n and 23p shown in FIG. 4E. FIG. 4F shows the structure of FIG. 4E after STI structures 71 have been receded to STI portions 77 and gate material 33 is formed.

In one embodiment, a method for forming a semiconductor device, is provided. The method comprises: separately forming n-type and p-type anti-punch through (APT) layers over or in a substrate surface, the n-type and p-type APT layers not overlapping one another; forming fin material over the n-type and p-type APT layers by epitaxial growth of undoped silicon; forming a masking pattern over the fin material, the masking pattern defining covered portions and uncovered portions; etching the uncovered portions thereby removing the fin material, the n-type and p-type APT layers and extending into the substrate to form discrete fins from the fin material; and forming shallow trench isolation (STI) structures between the discrete fins.

In another embodiment, a method for forming a semiconductor device, is provided. The method comprises: forming a first anti-punch through (APT) layer by epitaxial growth, the first APT layer being one of an n-type material and a p-type material; forming a barrier layer over the first APT layer; forming fin material over the barrier layer using epitaxial growth; forming discrete fins from the fin material by patterning and etching; forming shallow trench isolation (STI) structures in between the discrete fins; removing some of the discrete fins and corresponding underlying portions of the first APT layer and the barrier layer, thereby exposing portions of the substrate; forming a second APT layer by epitaxial growth on the portions of the substrate, the second APT layer being the other of the n-type and p-type material; and forming a barrier layer over the second epitaxial APT layer and a fin material over the barrier layer in the regions, thereby forming further discrete fins over the second APT layer In another embodiment, a method for forming a semiconductor device, is provided. The method comprises: forming shallow trench isolation (STI) devices in a silicon substrate; recessing portions of the silicon substrate between the STI devices to form receded Si surfaces such that the STI devices extend above the receded Si surfaces, each receded Si surface forming a bottom of a trench bounded by opposed STI devices. The method also provides for forming; in some of the trenches, an n-type APT layer on the corresponding receded Si surface, forming a barrier layer over the n-type APT layer and forming a silicon fin material over the barrier layer thereby forming first Si fins; and in other of the trenches, forming a p-type APT layer on the corresponding receded Si surface, forming a barrier layer over the p-type APT layer and forming a silicon fin material over the barrier layer thereby forming second Si fins.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A method for forming a semiconductor device, comprising:
    separately forming n-type and p-type anti-punch through (APT) layers over or in a substrate surface, said n-type and p-type APT layers not overlapping one another;
    forming fin material over said n-type and p-type APT layers by epitaxial growth of undoped silicon;
    forming a masking pattern over said fin material, said masking pattern defining covered portions and uncovered portions;
    etching said uncovered portions thereby removing said fin material, said n-type and p-type APT layers and extending into said substrate to form discrete fins from said fin material; and
    forming shallow trench isolation (STI) structures between said discrete fins.

2. The method as in claim 1, wherein said n-type and p-type APT layers are formed in said substrate surface by ion implantation.

3. The method as in claim 2, wherein said n-type APT layer includes Si and at least one of B, $BF_2$, and In, and said p-type APT layer includes Si and at least one of P and As.

4. The method as in claim 1, wherein said substrate is silicon and said n-type and p-type APT layers are formed over said substrate surface using epitaxial growth.

5. The method as in claim 4, wherein said n-type APT layer includes Si and at least one of B, $BF_2$, and In and said p-type APT layer includes Si and at least one of P and As.

6. The method as in claim 1, further comprising forming a barrier layer between said n-type APT layers and said fin material and between said p-type APT layer and said fin material, and wherein said etching further comprises removing said barrier layer in said uncovered portions.

7. The method as in claim 6, wherein said forming said barrier layer comprises epitaxial growth.

8. The method as in claim 6, wherein said barrier layer is a back-diffusion barrier layer formed of one of SiC and SiGe.

9. The method as in claim 1, wherein said n-type APT layer includes at least one of B, $BF_2$, and In, and said p-type APT layer includes at least one of P and As.

10. The method as in claim 1, further comprising forming a gate material over each of said discrete fins.

11. A method for forming a semiconductor fin device, said method comprising:
    forming a first anti-punch through (APT) layer by epitaxial growth, said first APT layer being one of an n-type material and a p-type material;
    forming a barrier layer over said first APT layer;
    forming fin material over said barrier layer using epitaxial growth;
    forming discrete fins from said fin material by patterning and etching;
    forming shallow trench isolation (STI) structures in between said discrete fins;
    removing some of said discrete fins and corresponding underlying portions of said first APT layer and said barrier layer, thereby exposing portions of said substrate;
    forming a second APT layer by epitaxial growth on said portions of said substrate, said second APT layer being the other of said n-type and p-type material; and
    forming a barrier layer over said second epitaxial APT layer and a fin material over said barrier layer in said regions,
    thereby forming further discrete fins over said second APT layer.

12. The method as in claim 11, wherein said fin material comprises one of undoped Si and SiGe, said barrier layer comprises a back-diffusion barrier layer formed by epitaxial growth and said barrier layer is formed of at least one of SiC and SiGe.

13. The method as in claim 11, wherein said forming STI structures in between said discrete fins comprises depositing an oxide layer over said discrete fins and planarizing such that said STI structures and said discrete fins have co-planar upper surfaces and further comprising oxide etching after said forming said further discrete fins thereby receding said upper surfaces of said STI structures such that said discrete fins and said further discrete fins extend above said upper surfaces of said STI structures, and
    further comprising forming a gate dielectric and a gate electrode over said discrete fins and over said further discrete fins.

14. The method as in claim 11, wherein said forming a first APT layer by epitaxial growth comprises epitaxial growth on a silicon substrate and said first APT layer includes Si and at least one of B, $BF_2$ and In.

15. The method as in claim 11, wherein said forming a first APT layer by epitaxial growth comprises epitaxial growth on a silicon substrate and said first APT layer includes Si and at least one of P and As and further comprising forming a gate dielectric and a gate electrode over said discrete fins and over said further discrete fins.

16. A method for forming a semiconductor fin device, said method comprising:
    forming shallow trench isolation (STI) devices in a silicon substrate;
    recessing portions of said silicon substrate between said STI devices to form recessed Si surfaces such that said STI devices extend above said recessed Si surfaces, each said recessed Si surface forming a bottom of a trench bounded by opposed STI devices;
    in some of said trenches, forming an n-type APT layer on said corresponding recessed Si surface, forming a barrier layer over said n-type APT layer and forming a silicon fin material over said barrier layer thereby forming first Si fins; and
    in other of said trenches, forming a p-type APT layer on said corresponding recessed Si surface, forming a barrier layer over said p-type APT layer and forming a silicon fin material over said barrier layer thereby forming second Si fins.

17. The method as in claim 16, wherein said recessed Si surfaces are above lowermost surfaces of said STI devices and wherein said forming an n-type APT layer and said forming a p-type APT layer each comprise said silicon fin material having an upper surface above an upper surface of said STI devices.

18. The method as in claim 16, wherein said forming an n-type APT layer is carried out using ion implantation and includes forming a masking material over said other of said trenches, and said forming a p-type APT layer is carried out using ion implantation and includes forming a masking material over said some of said trenches.

19. The method as in claim 16, further comprising forming a gate dielectric and a gate electrode over each of said first silicon fins and said second silicon fins.

20. The method as in claim 19, wherein each of said forming an n-type APT layer and said forming a p-type APT layer comprises epitaxial growth, said n-type APT layer includes Si and at least one of B, $BF_2$, and In, and said p-type APT layers includes Si and at least one of P and As, and further comprising forming FinFET devices using said first silicon fins and said second silicon fins.

* * * * *